US010796881B2

(12) United States Patent
Stegmann (10) Patent No.: US 10,796,881 B2
(45) Date of Patent: Oct. 6, 2020

(54) METHOD FOR PROCESSING AN OBJECT (71) Applicant: Carl Zeiss Microscopy GmbH, Jena (DE)

(72) Inventor: Heiko Stegmann, Dresden (DE)

(73) Assignee: Carl Zeiss Microscopy GmbH, Jena (DE)

(*) Notice: Subject to any disclaimer, the term of this patent is extended or adjusted under 35 U.S.C. 154(b) by 0 days.

(21) Appl. No.: 16/547,955

(22) Filed: Aug. 22, 2019

(65) Prior Publication Data
US 2020/0066483 A1 Feb. 27, 2020

(30) Foreign Application Priority Data
Aug. 23, 2018 (DE) .................. 10 2018 120 630

(51) Int. Cl.
H01J 37/26 (2006.01)
H01J 37/28 (2006.01)
H01J 37/244 (2006.01)

(52) U.S. Cl.
CPC .......... H01J 37/265 (2013.01); H01J 37/244 (2013.01); H01J 37/28 (2013.01);
(Continued)

(58) Field of Classification Search
CPC ........ H01J 37/265; H01J 37/26; H01J 37/261; H01J 37/30; H01J 37/3002; H01J 37/3005;
(Continued)

(56) References Cited

U.S. PATENT DOCUMENTS 4,980,562 A 12/1990 Berrian et al.
2006/0255270 A1* 11/2006 Kitamura .............. H01J 37/222
250/310
(Continued)

FOREIGN PATENT DOCUMENTS

DE 690 22 372 T2 3/1996

OTHER PUBLICATIONS

K.M. Boergens et al., "Controlling FIB-SBEM slice thickness by monitoring the transmitted ion beam", Journal of Microscopy, vol. 252, No. 3, 2013, pp. 258-262.
(Continued)

Primary Examiner — Jason L McCormack
(74) Attorney, Agent, or Firm — Fish & Richardson P.C.

(57) ABSTRACT

A method for processing an object, with material being removed from the object, includes directing a particle beam on the object so that a location of incidence of the particle beam on the object carries out a movement along a principal scanning path and a movement along a sub-scanning direction oriented transverse to the principal scanning path. The movement of the location of incidence of the particle beam along the sub-scanning direction is controlled on the basis of a reference signal and a detection signal. The method also includes modulating the directing of the particle beam in accordance with the reference signal, and detecting secondary particles and producing the detection signal, which represents an intensity of the detected secondary particles. Controlling the movement of the location of incidence of the particle beam along the sub-scanning direction is implemented using the principle of homodyne detection.

27 Claims, 7 Drawing Sheets (52) U.S. Cl.
    CPC .......... *H01J 2237/2448* (2013.01); *H01J 2237/2802* (2013.01); *H01J 2237/3174* (2013.01)

(58) Field of Classification Search
    CPC .. H01J 37/3007; H01J 37/304; H01J 37/3045; H01J 37/31; H01J 37/3056
    USPC ..... 250/306, 307, 311, 492.1, 492.2, 492.21, 250/492.22, 492.23, 492.3
    See application file for complete search history.

(56) References Cited

U.S. PATENT DOCUMENTS

| | | | |
|---|---|---|---|
| 2009/0135240 A1* | 5/2009 | Phaneuf | G01N 1/286 347/246 |
| 2015/0048248 A1 | 2/2015 | Biberger et al. | |
| 2015/0243477 A1 | 8/2015 | Stone et al. | |
| 2016/0118219 A1 | 4/2016 | Potocek et al. | |
| 2016/0365224 A1* | 12/2016 | Potocek | H01J 37/244 |

OTHER PUBLICATIONS

A. A. Tseng, "Recent developments in micromilling using focused ion beam technology", Journal of micromechanics and microengineering, vol. 14, 2004, S. R15-R34.

L. A. Giannuzzi et al., "A review of focused ion beam milling techniques for TEM specimen preparation", Micron, vol. 30, 1999, pp. 197-204.

German Office Action, with translation thereof, for corresponding DE application No. 10 2018 120 630.5 dated Jun. 11, 2019.

\* cited by examiner

METHOD FOR PROCESSING AN OBJECT

FIELD

The present disclosure relates to a method for processing an object using a particle beam, more particularly using an ion beam or an electron beam. By way of example, the method can be used to produce an object (TEM object) that is suitable for examination via transmission electron microscopy (TEM). That is to say, the method is suitable for producing objects that have a thickness of the order of 1 nm to several 100 nm. Further, the method can be used to ablate layers of a predetermined thickness from an object such that the method can be used as part of a method for the tomography of an object. Further, the method can be used to produce nanostructures on the surface of an object by virtue of material being removed from the object and the remaining material forming the nanostructures (nanopatterning, nanomachining).

BACKGROUND

The controlled removal of material from an object is involved for producing a TEM object, for tomography of an object and for producing nanostructures via nanopatterning and nanomachining. By way of example, a layer of predetermined thickness is repeatedly removed from the object in a topography method. An object with a predetermined thickness is produced in a method for producing a TEM object, involving controlled and highly precise removal of material from the object. In nanopatterning and nanomachining, nanostructures are produced from a substrate by exposing the nanostructures; this likewise involves highly precise removal of material from an object.

Conventional methods for removing material from an object using a particle beam involve repeated recording of images during the removal of material from the object in order to monitor the amount of ablated material and the current form of the object to be processed. By way of example, repeated recording of images of the object allows determination and correction of the drift of the particle beam in respect of the object and the drift of an object holder holding the object, or of the object itself, in relation to a particle beam column, which produces the particle beam. Here, the overall amount of drift accumulated in the time between the last image recording and the current image recording is corrected after the current image recording. The drift occurring in the times between two image recordings can only be corrected by extrapolation of the drift under the assumption of the constancy thereof in time. These images are usually recorded via an electron beam (for example, scanning electron microscopy) or an ion beam, which in turn harbours unwanted side-effects. By way of example, this may lead to electric charging or structural damage of the object to be processed and the time for recording the images may slow the entire processing process, for example if the processing of the object with an ion beam is interrupted for the purposes of recording images of the object using an electron beam or the ion beam. Other conventional methods measure the attenuation of the particle beam below the object, the attenuation arising from the removal of material from the object and being proportional to the amount of material removed. However, this involves a specific detector and a specific geometric form of the object.

SUMMARY

The present disclosure seeks to provide a method for processing an object using a particle beam, wherein the drift between the particle beam and the object is continuously captured and corrected. The method can be applicable to any desired object without restrictions in respect of the form or composition thereof. The method, more particularly the control of the particle beam, can be able to be carried out without the additional recording of images of the object. The method can be able to be carried out using conventional particle beam systems.

According to one aspect, a method for processing an object includes the removal of material from the object, wherein the removal of material from the object includes: directing a particle beam on the object in such a way that a location of incidence of the particle beam on the object carries out a movement along a principal scanning path (HSP) and a movement along a sub-scanning direction (SSR) oriented transverse to the principal scanning path, wherein the movement of the location of incidence of the particle beam along the sub-scanning direction is controlled on the basis of a reference signal and a detection signal; modulating the directing of the particle beam in accordance with the reference signal; detecting secondary particles and producing the detection signal, which represents an intensity of the detected secondary particles.

The particle beam is suitable for removing material from the object. To this end, the particle beam can be an ion beam, for example. Alternatively, the particle beam can be an electron beam. Moreover, the supply of a process gas, which may improve the removal of material further, may be advantageous. However, the method is not restricted to a beam of charged particles and can be carried out using any particle beam that is suitable for removing material from the object.

According to the method, the particle beam is moved over the object. In the process, the location of incidence of the particle beam on the object carries out an overall movement that can be divided into a movement along a principal scanning path and a movement along a sub-scanning direction. This means that the overall movement is a superposition of the movement along the principal scanning path and the movement along the sub-scanning direction.

The principal scanning path can be any path. By way of example, the principal scanning path can be a straight line along a principal scanning direction (HSR). By way of example, the particle beam or its location of incidence on the object is continuously moved back and forth in the principal scanning direction. The movement along the principal scanning path can be carried out in accordance with an oscillation (e.g., sinusoidal oscillation) such that the particle beam or its location of incidence is guided along the principal scanning path from a first location on the object to a second location on the object and from the second location back to the first location. Alternatively, the movement along the principal scanning path can be carried out in accordance with a sawtooth oscillation such that the particle beam is guided from the first location to the second location and returned from the second location to the first location, with the particle beam not being directed on the object during the return. Other forms of movement along the principal scanning path are possible.

According to the method, the particle beam is also moved over the object in the sub-scanning direction. By way of example, the sub-scanning direction is oriented transverse to the principal scanning path. The principal scanning path and the sub-scanning direction can each be oriented substantially perpendicular to the particle beam. In particular, the principal scanning path and the sub-scanning direction can each be oriented substantially perpendicular to a central axis of a particle beam column, which produces the particle beam, or be oriented perpendicular to the non-deflected particle beam. The principal scanning path and the sub-scanning direction may (moreover) be oriented substantially perpendicular to one another.

Secondary particles are produced as a result of the interaction of the particle beam with the object while the particle beam is directed on the object and guided over the object along the principal scanning path and along the sub-scanning direction, the secondary particles being detected according to the method. Accordingly, secondary particles can be particles of the particle beam scattered on the object or particles arising as a result of the interaction of the particle beam with the object, for example secondary electrons or ions. An intensity of a particle flow of secondary particles incident on a detection surface of a detector is detected. The intensity, or the time curve thereof, is represented by the detection signal which is used to control the movement of the particle beam, or of the location of incidence thereof, along the sub-scanning direction.

The inventor of the present disclosure has recognized that the detection signal itself is no direct measure for the ablation rate of material from the object in the sub-scanning direction. Rather, the detection signal is composed of a plurality of different contributions. However, the contribution to the detection signal produced by the removal of material from the object at a cut surface of the object can be extracted from the detection signal using the method according to the disclosure. Thereupon, this contribution is used to control the particle beam or the movement of the location of incidence in the sub-scanning direction. The principle of homodyne detection is applied to be able to extract from the detection signal the contribution caused by the removal of material from the object at the cut surface in the sub-scanning direction.

Accordingly, the production of this contribution is modulated by the reference signal (e.g., by the frequency of the reference signal) such that the detection signal includes frequency components that lie in the spectral range around the frequency of the reference signal. The modulation of the contribution is achieved by modulating the directing of the particle beam in accordance with the reference signal.

By way of example, the modulation of the directing may be a variation in the intensity of the particle beam at the location of incidence. Alternatively, the modulation can be a variation in the location of incidence itself, for example. The modulation or the variation is implemented in accordance with the reference signal. By way of example, this means that the modulation or the variation is implemented at a frequency of the reference signal. By way of example, the modulation or the variation is substantially proportional to the reference signal.

As a consequence, the contribution to the detection signal caused by the removal of material from the object at the cut surface in the sub-scanning direction is modulated by the frequency of the reference signal and can be extracted from the detection signal via homodyne detection. Consequently, the advance of the particle beam, i.e., the movement of the location of incidence of the particle beam on the object along the sub-scanning direction, can be controlled on the basis of the detection signal and the reference signal.

According to one embodiment, the modulation of the directing of the particle beam includes modulating the intensity of the particle beam supplied to the object in accordance with the reference signal. In this embodiment, the intensity of the particle beam striking the object (at the location of incidence) is modulated in accordance with the reference signal. Accordingly, the intensity of the particle beam at the location of incidence changes over time in accordance with the reference signal.

By way of example, the intensity of the particle beam supplied to the object is modulated by virtue of the particle beam, in accordance with the reference signal, alternately being directed on the object and not being directed on the object. By way of example, this is achieved by a stop that alternately blocks the particle beam with the clock of the reference signal, such that the particle beam is not incident on the object, and passes the particle beam such that the particle beam is incident on the object. Alternatively, the strength of the beam current can be varied in accordance with the reference signal or the focus of the particle beam can be varied in accordance with the reference signal.

As already explained above, the principle of homodyne detection can be used for controlling the movement of the location of incidence of the particle beam along the sub-scanning direction. To this end, controlling the movement of the location of incidence of the particle beam along the sub-scanning direction includes determining a mixed signal by multiplicative mixing of the reference signal and the detection signal. Integrating the mixed signal produces an intermediate signal, which is a measure for the ablation rate of material from the object in the sub-scanning direction and which is used for controlling the movement of the location of incidence of the particle beam along the sub-scanning direction. By way of example, the integration is implemented over a plurality of periods of the frequency of the reference signal. By way of example, the moving window integration can be carried out by filtering using a low-pass filter. The intermediate signal represents the contribution to the detection signal caused by the removal of material from the object at the cut surface. Therefore, the intermediate signal is a measure for the ablation rate of material in the sub-scanning direction. By way of example, the movement of the location of incidence of the particle beam along the sub-scanning direction is set by a feedback controller that uses the intermediate signal to this end.

By way of example, the movement of the location of incidence of the particle beam along the sub-scanning direction is set by the feedback controller in such a way that the intermediate signal adopts an adjustable behaviour, in particular converges to an adjustable setpoint value. What this achieves is that material is removed from the object in the sub-scanning direction at a rate that is represented by the setpoint value. Consequently, material can be removed from the object in controlled fashion without having to record additional images of the object in the meantime.

According to one embodiment, the directing of the particle beam is modulated by virtue of the movement of the location of incidence of the particle beam along the sub-scanning direction being implemented at an SSR overall velocity, which is composed of at least a first velocity and a second velocity, wherein the first velocity is continuously changed (i.e., modulated) in accordance with the reference signal and wherein the second velocity is set on the basis of the reference signal and the detection signal.

Here, the "SSR overall velocity" merely represents the component of the overall velocity, oriented along the sub-scanning direction, of the location of incidence of the particle beam in relation to the object. Expressed differently, the "SSR overall velocity" denotes the projection onto the sub-scanning direction of the overall velocity of the location of incidence of the particle beam in relation to the object.

In this embodiment, the directing is modulated by varying the location of incidence of the particle beam on the object along the sub-scanning direction. To this end, the SSR overall velocity of the location of incidence is composed at least of a first (time-dependent) and a second (time-dependent) velocity, wherein the first velocity is continuously changed (i.e., modulated) in accordance with the reference signal and wherein the second velocity is set on the basis of the reference signal and the detection signal.

Therefore, the SSR overall velocity can be defined, for example, as a sum of the (time-dependent) first velocity and the (time-dependent) second velocity. In respect of the object, the particle beam or the location of incidence thereof on the object carries out a (time-dependent) overall movement along the sub-scanning direction ("SSR overall movement") on account of the SSR overall velocity, the SSR overall movement being composed of at least a first partial movement along the sub-scanning direction and a second partial movement along the sub-scanning direction, wherein the first partial movement is (only) caused by the first velocity and the second partial movement is (only) caused by the second velocity. Expressed differently, the particle beam or the location of incidence thereof carries out a plurality of temporally superposed partial movements in relation to the object along the sub-scanning direction, the partial movements together yielding the SSR overall movement, wherein the SSR overall movement is parameterized by the SSR overall velocity and the partial movements along the sub-scanning direction are parameterized by the first and second velocity.

In this embodiment, the first velocity is constantly changed in accordance with the reference signal. This means that the first velocity, which parameterizes the first partial movement along the sub-scanning direction, is a variable that changes as a function of time, to be precise depending on the reference signal. By way of example, the first velocity changes with a frequency that corresponds to the frequency of the reference signal. By way of example, the reference signal can be a (sinusoidal) oscillation at a reference frequency and the first velocity changes with the reference frequency. This means that the first velocity changes with the reference frequency. Therefore, the time profile of the first velocity in this example is an oscillation, the frequency of which equals the reference frequency.

The reference signal can define the first velocity in such a way that the first partial movement is a continuous back-and-forth movement of the particle beam or of the location of incidence thereof in relation to the object along the sub-scanning direction.

The second velocity parameterizes the second partial movement along the sub-scanning direction. By way of example, the second partial movement corresponds to an approximately linear advance of the particle beam or of the location of incidence thereof in relation to the object along the sub-scanning direction. This means that the second velocity is approximately constant in time. However, the specific value of the second velocity is set depending on the reference signal and depending on the detection signal, for example by a feedback controller. The rate at which material is removed from the object in the sub-scanning direction is substantially set by the second velocity.

In other words, the overall movement of the particle beam or of the location of incidence thereof in relation to the object along the sub-scanning direction can be expressed as follows: The particle beam or the location of incidence thereof is moved in relation to the object in the sub-scanning direction according to an SSR overall movement, wherein a first partial movement, parameterized by the first velocity, represents the movement of the particle beam or of the location of incidence thereof in relation to a reference position and wherein a second partial movement, parameterized by the second velocity, represents the movement of the reference position in relation to the object. The first velocity is continuously changed in accordance with the reference signal in such a way that, in respect of the reference position, the particle beam or the location of incidence thereof is continuously moved around the reference position in the sub-scanning direction, while the reference position is moved in relation to the object in the sub-scanning direction in accordance with the second velocity.

According to an exemplary embodiment, the SSR overall velocity alternately decreases and increases. Accordingly, the particle beam or the location of incidence thereof is alternately accelerated and decelerated relative to the object in the sub-scanning direction. According to an exemplary embodiment herein, the SSR overall velocity alternately has positive and negative values. As a result, the particle beam or the location of incidence thereof is alternately moved forwards and backwards with respect to the object in the sub-scanning direction.

According to an exemplary embodiment, the reference signal is a periodic signal, for example a sinusoidal oscillation, a rectangular oscillation or the like. As a result, the first velocity is changed in such a way that the first velocity alternately decreases and increases. In particular, the first velocity can alternately have positive and negative values as a result thereof. As a result, the particle beam or the location of incidence thereof is periodically accelerated and decelerated in the sub-scanning direction with respect to the reference position or moved forwards and backwards around the reference position.

According to an exemplary embodiment, the second velocity always has positive values. Accordingly, the second velocity has no negative values. This means that the reference position is moved forwards relative to the object in the sub-scanning direction. Expressed differently, the second velocity or the second partial movement connected therewith represents a continuous advance of the reference position with respect to the object in the sub-scanning direction.

According to an exemplary embodiment, the second velocity is set on the basis of the reference signal and the detection signal using the principle of homodyne detection. By way of example, the following steps are carried out to this end: determining a mixed signal by multiplicative mixing of the reference signal and the detection signal, and determining an intermediate signal by moving window integration of the mixed signal. By way of example, the integration is implemented over a plurality of periods of the frequency of the reference signal. By way of example, the moving window integration can be carried out by filtering using a low-pass filter. The intermediate signal represents the contribution to the detection signal caused by the removal of material from the object at the cut surface. Therefore, the intermediate signal is a measure for the ablation rate of material in the sub-scanning direction. Thereupon, the second velocity can be set on the basis of the intermediate signal.

According to an exemplary embodiment, the second velocity is set by a feedback controller that uses the intermediate signal. By way of example, the second velocity is set by the feedback controller in such a way that the intermediate signal adopts an adjustable behaviour, in particular converges to an adjustable setpoint value. What this achieves is that material is removed from the object in the sub-scanning direction at a rate that is represented by the setpoint value. Consequently, material can be removed from the object in controlled fashion without having to record additional images of the object in the meantime.

In accordance with an exemplary embodiment, the particle beam is directed on locations of the object during movement of the particle beam or of the location of incidence thereof in the sub-scanning direction, in particular by the component of the first velocity of the SSR overall velocity, the locations having a distance from one another in the sub-scanning direction that is at least 0.1 nm, more particularly at least 1 nm, and/or that is no more than 100 000 nm, more particularly no more than 10 000 nm. By moving the location of incidence along the sub-scanning direction, in particular by the first partial movement, the particle beam is directed on different locations of the object along the sub-scanning direction. These locations have a minimum distance and a maximum distance from one another, which are defined by the specified values. Therefore, this distance denotes the path length that the particle beam or the location of incidence thereof travels between these locations on the object along the sub-scanning direction on account of the movement of the location of incidence along the sub-scanning direction, in particular on account of the first partial movement, i.e., as a result of the component of the first velocity of the overall velocity.

The particle beam is directed on locations on the object by moving the location of incidence of the particle beam along the principal scanning path (HSP), the locations having a distance from one another along the principal scanning path that is at least 1 nm, more particularly at least 10 nm, and/or that is no more than 1 000 000 nm, more particularly no more than 100 000 nm. Therefore, this distance denotes the path length that the particle beam or the location of incidence thereof travels between these locations on the object along the principal scanning path on account of the movement of the location of incidence of the particle beam along the principal scanning path.

According to exemplary embodiments, the particle beam is deflected to the extent of a sub-scanning deflection angle in the sub-scanning direction as a result of the movement of the location of incidence along the sub-scanning direction or the component of the first velocity of the overall velocity, wherein the sub-scanning deflection angle is at least 0.00001 mrad, more particularly at least 0.0001 mrad, and/or wherein the sub-scanning deflection angle is no more than 10 mrad, more particularly no more than 1 mrad. The aforementioned values restrict the maximum and minimum deflection of the particle beam caused by the movement of the location of incidence along the sub-scanning direction or the first partial movement. The deflection in the sub-scanning direction can be smaller, more particularly significantly smaller, than the deflection along the principal scanning path. By way of example, the particle beam is deflected along the principal scanning path to the extent of a principal scanning deflection angle, wherein the principal scanning deflection angle is at least 0.0001 mrad, more particularly at least 0.001 mrad, and/or wherein the principal scanning deflection angle is no more than 100 mrad, more particularly no more than 10 mrad.

According to one embodiment, the movement of the particle beam or of the location of incidence thereof in the sub-scanning direction is implemented by deflecting the particle beam relative to a particle beam column, which produces the particle beam, and by moving the object relative to the particle beam column in the sub-scanning direction. Here, the deflection can be implemented in accordance with the reference signal in order to bring about the first velocity while the object is moved relative to the particle beam column in accordance with the second velocity. Expressed differently, the first partial movement is carried out by deflection of the particle beam relative to the particle beam column while the second partial movement is carried out by the movement of the object relative to the particle beam column. Accordingly, the particle beam or the location of incidence thereof can be moved with respect to the reference position in the sub-scanning direction at the first velocity by deflecting the particle beam relative to the particle beam column, while the reference position is implemented with respect to the object in the sub-scanning direction at the second velocity by moving the object relative to the particle beam column in the sub-scanning direction.

Alternatively, the object can be moved relative to the particle beam column in the sub-scanning direction in accordance with the reference signal in order to bring about the first velocity, while the deflection is carried out in accordance with the second velocity. Expressed differently, the second partial movement is carried out by deflection of the particle beam relative to the particle beam column while the first partial movement is carried out by the movement of the object relative to the particle beam column. Accordingly, the particle beam or the location of incidence thereof can be moved with respect to the reference position in the sub-scanning direction at the first velocity by moving the object relative to the particle beam column in the sub-scanning direction, while the reference position is implemented with respect to the object in the sub-scanning direction at the second velocity by deflecting the particle relative beam to the particle beam column.

The SSR overall movement of the particle beam relative to the object or the SSR overall movement of the location of incidence of the particle beam on the object with respect to the object can also be realized in other ways. In accordance with one exemplary embodiment, the location of incidence of the particle beam is moved along the sub-scanning direction by (only) deflecting the particle beam relative to a particle beam column, which produces the particle beam. According to this embodiment, the SSR overall movement is brought about by deflecting the particle beam relative to the particle beam column.

Alternatively, the location of incidence of the particle beam can also be moved along the sub-scanning direction by (only) moving the object relative to the particle beam column. By way of example, an object positioning apparatus carrying the object can be controlled in such a way that the object is moved relative to the particle beam column in accordance with the SSR overall movement.

The reference signal may have a frequency that differs from zero. According to exemplary embodiments, the reference signal has a frequency of at least 500 Hz, more particularly at least 1 kHz, further more particularly at least 10 kHz.

The movement of the location of incidence of the particle beam along the principal scanning path (HSP) can be carried out at a frequency that is at least ten times, more particularly at least one hundred times that of the frequency of the reference signal. Accordingly, the particle beam is moved significantly faster along the principal scanning path than in the sub-scanning direction.

However, in some principal scanning paths, the movement of the location of incidence of the particle beam along the principal scanning path (HSP) may also be implemented more slowly than in the sub-scanning direction. By way of example, this is the case in nanopatterning and nanomachining. Accordingly, the movement of the location of incidence of the particle beam along the principal scanning path (HSP) can be carried out at a frequency that is at least ten times smaller, more particularly at least one hundred times smaller than the frequency of the reference signal.

The methods described above can also be carried out with simultaneous use of a scanning electron microscope. The simultaneous use of a scanning electron microscope causes the detection signal to contain contributions that are caused by the irradiation of the object by the electron beam of the scanning electron microscope. Therefore, the simultaneous use of a scanning electron microscope usually makes the analysis of the detection signal more difficult, if the latter should be used to control the ablation rate of material from the object in the sub-scanning direction. However, as a result of applying the principle of homodyne detection, the contributions to the detection signal caused by the scanning electron microscope do not have a negative effect on the control of the movement of the location of incidence along the sub-scanning direction or the second velocity, or do not make the control more difficult, provided the frequencies at which the electron beam is scanned over the object differ sufficiently from the frequency of the reference signal. Accordingly, images of the object can be recorded by a scanning electron microscope while material is removed from the object, without this having a negative effect on the result of the method.

The movement of the location of incidence of the particle beam along the sub-scanning direction can further be controlled on the basis of such recorded images. By way of example, the progress of removing material from the object can be checked from time to time using the images recorded via the electron microscope, wherein the intervals between the recording of the images with the scanning electron microscope can be significantly longer than is the case in conventional methods.

The method described above for processing an object can be used in numerous applications. By way of example, the method can be used for the tomography of an object, wherein material layers are successively removed from the object using the above-described method and images of the object are recorded between or during the removal of the layers.

By way of example, a method for the tomography of an object may include: exposing a surface of an object by removing material from the object according to the method described herein, recording an image of the object, more particularly of the exposed surface, for example via a scanning electron microscope, repeating the exposing and recording multiple times; and producing a cross-sectional image on the basis of the recorded images. Accordingly, the cross-sectional image is generated from parts of the images recorded previously. A plurality of cross-sectional images can be used to present a three-dimensional representation of the object. Exposing the surface and recording an image of the object can be carried out at the same time or in succession.

BRIEF DESCRIPTION OF THE DRAWINGS

Exemplary embodiments of the disclosure are explained in greater detail below with reference to figures, in which.

DESCRIPTION OF EXEMPLARY EMBODIMENTS

Figure 1A:
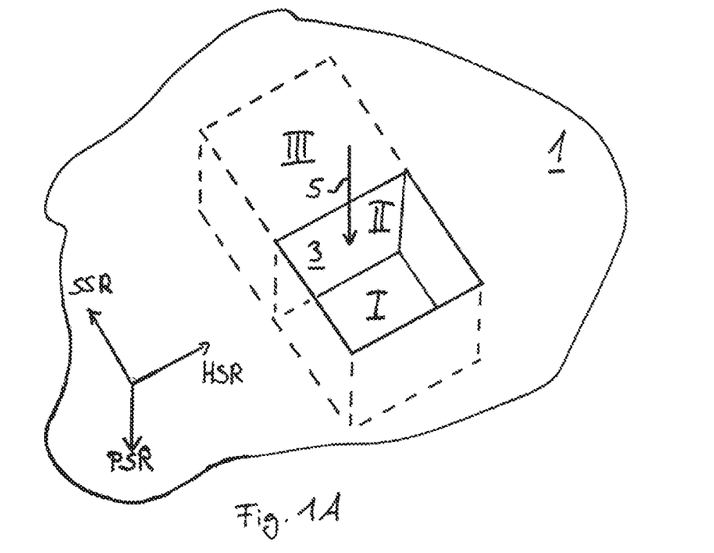
FIGS. 1A to 1C show views of an object to be processed.

FIG. 1A shows a perspective illustration of an object 1 to be processed. The object 1 includes a region I that represents a volume region from which material was removed from the object 1. A region II represents a volume region of the object 1 containing a cut surface 3, a particle beam 5 (e.g., ion beam, electron beam with or without process gas, laser beam) being directed thereon in order to remove material from the object 1. A region III represents a volume region of the object 1 that should be removed via the particle beam 5. A rectangular coordinate system with directions of principal scanning direction (HSR), sub-scanning direction (SSR) and particle beam direction (PSR) serves for a simplified description of the method, described below, for processing the object 1.

Figure 1B:
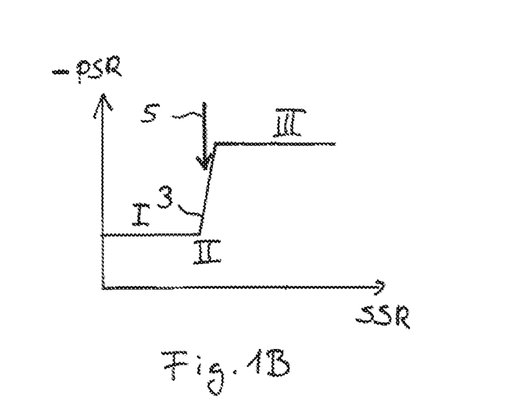

FIG. 1B shows a cross-sectional view in the PSR-SSR plane through the regions I, II and III. For the purposes of illustrating the method described below, the assumption is made that material should be removed from the object 1 along the sub-scanning direction SSR. Using the particle beam 5, the object 1 is processed in such a way that the region II is displaced to the right in FIG. 1B and displaced upwards in FIG. 1C.

Figure 1C:
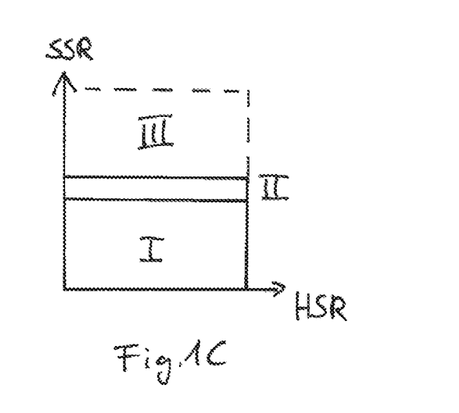

FIG. 1C shows a view of the object 1 along the PSR direction on the HSR-SSR plane. The regions I, II and III are illustrated schematically in order to show the advance of the removal of material from the object 1.

Figure 2A:
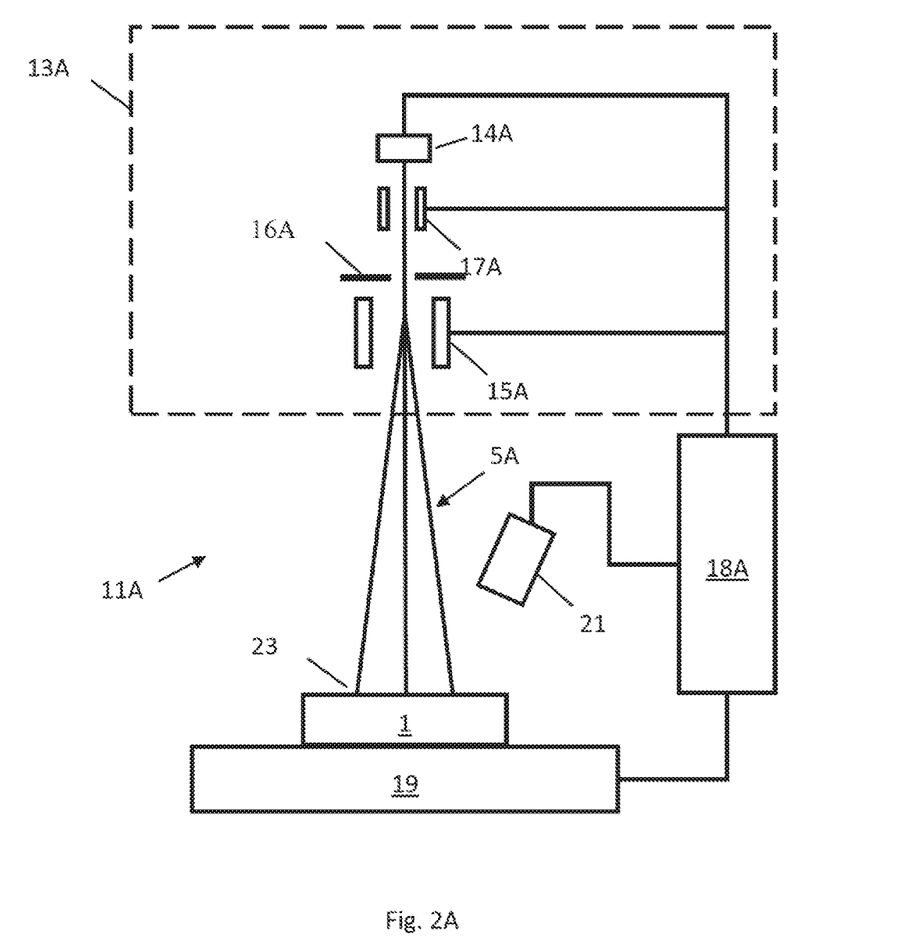
FIGS. 2A and 2B show systems for processing an object.

FIG. 2A is a schematic illustration of a particle beam system 11A for carrying out the methods described herein for processing an object. The particle beam system 11A includes a particle beam column 13A, which is configured to direct a particle beam 5A on the object 1, where the particle beam 5A strikes the object 1 at a location of incidence 23. The particle beam column 13A includes a particle source 14A, which can produce the particle beam 5A, and deflectors 15A, which can deflect the particle beam 5A in order to be able to direct the particle beam 5A on different locations on the object 1. FIG. 2A schematically shows three different deflections of the particle beam 5A.

The particle beam system 11A further includes a controller 18A, which is configured to control the components of the particle beam system 11A. To this end, the particle source 14A and the deflectors 15A are connected to the controller 18A of the particle beam system 11A. A program for controlling the particle beam system 11A can be stored in the controller 18A, wherein the program, when executed by the controller 18A of the particle beam system 11A, controls the particle beam system 11A in such a way that the particle beam system 11A carries out the methods described herein. The program can be transferred from a data processing apparatus (not shown) to the controller 18A so that it can be carried out by the latter.

The particle beam system 11A further includes a stop 16A, which can block and pass the particle beam 5A depending on whether or not a deflector 17A controlled by the controller 18A deflects the particle beam 5A. As a result, the intensity with which the particle beam 5A strikes the object 1 can be modulated. Other apparatuses for modulating the intensity of the particle beam may be provided instead of the stop 16A, which either blocks or passes the particle beam 5A. By way of example, the intensity of the particle beam 5A can be controlled by the particle source 14A. Further, a stop with an aperture can be provided in the beam path of the particle beam 5A, for example, the stop alternately blocking and freeing the particle beam by way of a mechanical movement of the stop. The mechanical movement may be driven by a motor. By way of example, the stop can be a rotating stop.

The particle beam system 11A further includes an object positioning apparatus 19, which is configured to arrange the object 1 in relation to the particle beam column 13A. By way of example, the object positioning apparatus 19 may provide a plurality of translational and rotational controllable degrees of freedom in order to position and orient the object 1 relative to the particle beam column 13A. The object positioning apparatus 19 can likewise be controlled by the controller 18A.

The particle beam system 11A further includes a detector 21, which is configured to detect secondary particles produced by the particle beam 5A at the object 1 and to produce a detection signal that represents the intensity of the detected secondary particles. The controller 18A receives the detection signal from the detector 21.

The controller 18A may control or include a signal generator (not shown), which produces a reference signal. The reference signal is used to modulate the intensity of the particle beam 5A directed on the object 1 and/or to modulate the location of incidence 23 of the particle beam 5A on the object 1.

Figure 2B:
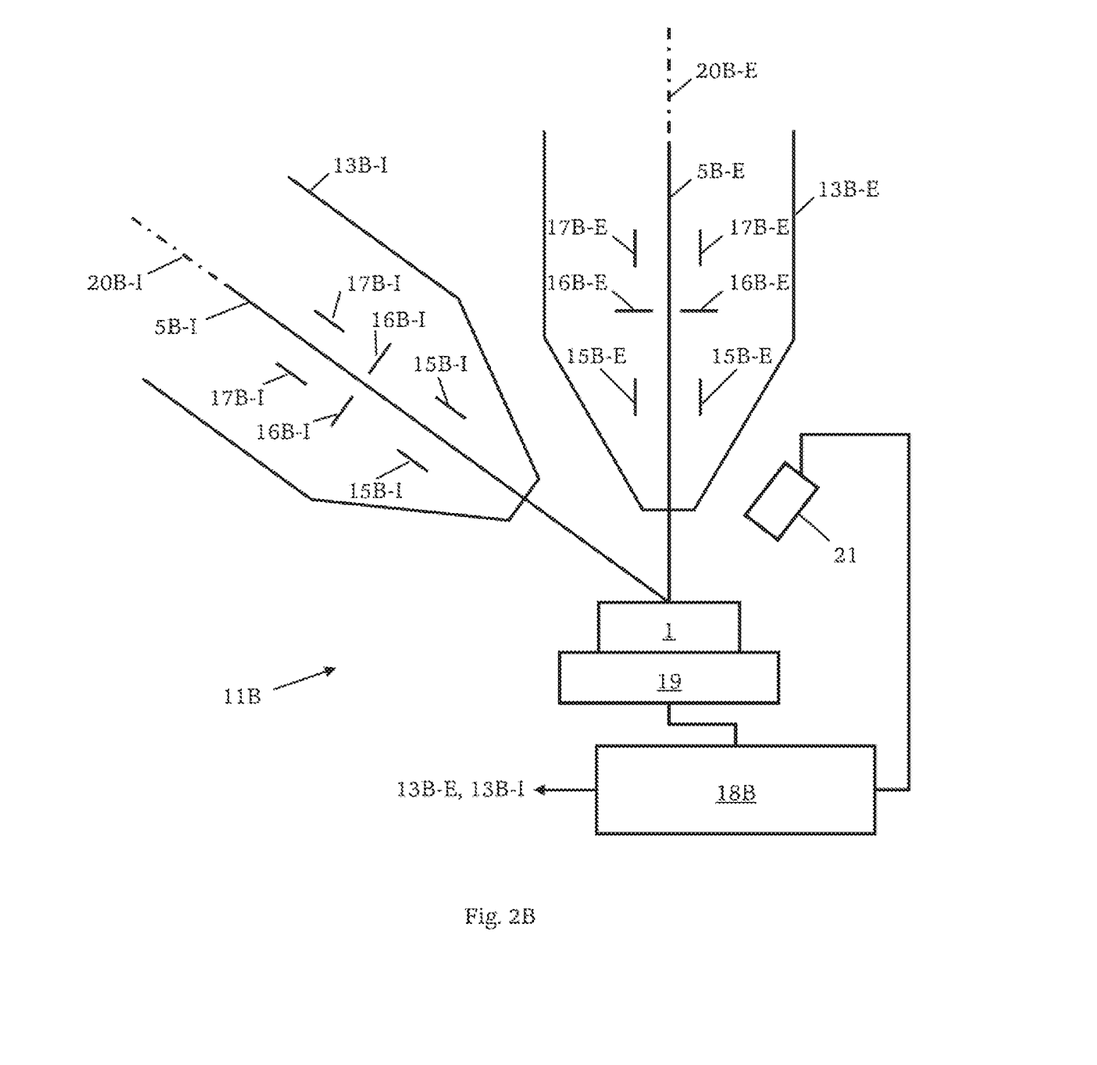

FIG. 2B shows a further particle beam system 11B for carrying out the methods for processing an object 1, as described herein. The particle beam system 11B includes an electron beam column 13B-E and an ion beam column 13B-I. A principal axis 20B-E of the electron beam column 13B-E and a principal axis 20B-I of the ion beam column 13B-I intersect in a common work region and include an angle of approximately 54° with one another. An alternative arrangement of the two particle beam columns provides for the principal axis 20B-E of the electron beam column 13B-E and the principal axis 20B-I of the ion beam column 13B-I to be oriented perpendicular to one another and to intersect in the common work region. The object 1 to be processed, which is arranged on an object positioning apparatus 19, is arranged in the common work region of the electron beam column 13B-E and the ion beam column 13B-I.

The electron beam column 13B-E is configured to produce an electron beam 5B-E and direct the latter on the object 1. Deflectors 17B-E of the electron beam column 13B-E can deflect the electron beam 5B-E in such a way that the electron beam 5B-E passes a stop 16B-E through an aperture provided therein or the electron beam is blocked by the stop 16B-E. In this way, the electron beam 5B-E can quickly be activated and deactivated, in the sense of it striking the object 1 or not striking the object 1. Further deflectors 15B-E of the electron beam column 13B-E are configured to deflect the electron beam 5B-E in order thus to vary the location of incidence at which the electron beam 5B-E strikes the object 1.

The ion beam column 13B-I is configured to produce an ion beam 5B-I and direct the latter on the object 1. Deflectors 17B-I of the ion beam column 13B-I can deflect the ion beam 5B-I in such a way that the ion beam 5B-I passes a stop 16B-I through an aperture provided therein or the ion beam is blocked by the stop 16B-I. In this way, the ion beam 5B-I can quickly be activated and deactivated, in the sense of it striking the object 1 or not striking the object 1. Further deflectors 15B-I of the ion beam column 13B-I are configured to deflect the ion beam 5B-I in order thus to vary the location of incidence at which the ion beam 5B-I strikes the object 1.

Further, the particle beam system 11B includes a detector 21 for secondary particles and a controller 18. The controller 18 is connected to the electron beam column 13B-E, the ion beam column 13B-I and the detector 21 in order to control these components or receive the (measurement) signals therefrom. Like the controller 18 of FIG. 2A, too, the controller 18 can store, in particular, a program for controlling the particle beam system 11B, wherein the program, when executed by the controller 18 of the particle beam system 11B, controls the particle beam system 11B in such a way that the particle beam system 11B carries out the methods described herein. The program can be transferred from a data processing apparatus (not shown) to the controller 18 so that it can be carried out by the latter.

The methods described herein can be carried out both using the electron beam 5B-E and using the ion beam 5B-I.

According to a method according to the disclosure for processing the object 1, material is removed from the object 1 by virtue of the particle beam 5 being directed on the object 1 in such a way that the location of incidence 23 of the particle beam 5 on the object 1 carries out a movement along a principal scanning path (illustrated in simplified fashion as principal scanning direction HSR in FIG. 1) and a movement along a sub-scanning direction SSR that is oriented transverse to the principal scanning path. The intensity of the particle beam 5 supplied to the object 1 is modulated in accordance with the reference signal, for example by virtue of the particle beam 5 being deflected on the stop 16 by the deflectors 17 in such a way that the particle beam 5 is alternately directed on the object 1 and blocked by the stop 16 with the (fundamental) frequency of the reference signal. In the meantime, secondary particles are detected via the detector 21 and a detection signal that represents the intensity of the detected secondary particles is produced and transferred to the controller 18. On the basis of the detection signal and the reference signal, the controller controls the movement of the location of incidence 23 along the sub-scanning direction SSR by deflecting the particle beam 5 via the deflectors 15, by moving the object 1 relative to the particle beam column 13 via the object positioning apparatus 19 or by a combination of these approaches.

Controlling the movement of the location of incidence 23 along the sub-scanning direction SSR by the controller 18 is explained in more detail below in conjunction with FIGS. 6 and 7.

In the just described example, the directing of the particle beam 5 on the object 1 is modulated by modulating the intensity of the particle beam 5 directed on the object 1. Moreover, or as an alternative thereto, the directing of the particle beam 5 can be modulated by modulating the location of incidence 23 of the particle beam 5 on the object 1 in the sub-scanning direction. Modulating the location of incidence 23 of the particle beam 5 on the object 1 in the sub-scanning direction can be carried out by deflecting the particle beam 5 via the deflectors 15, by moving the object 1 relative to the particle beam column 13 via the object positioning apparatus 19 or by a combination of these approaches.

Figure 3:
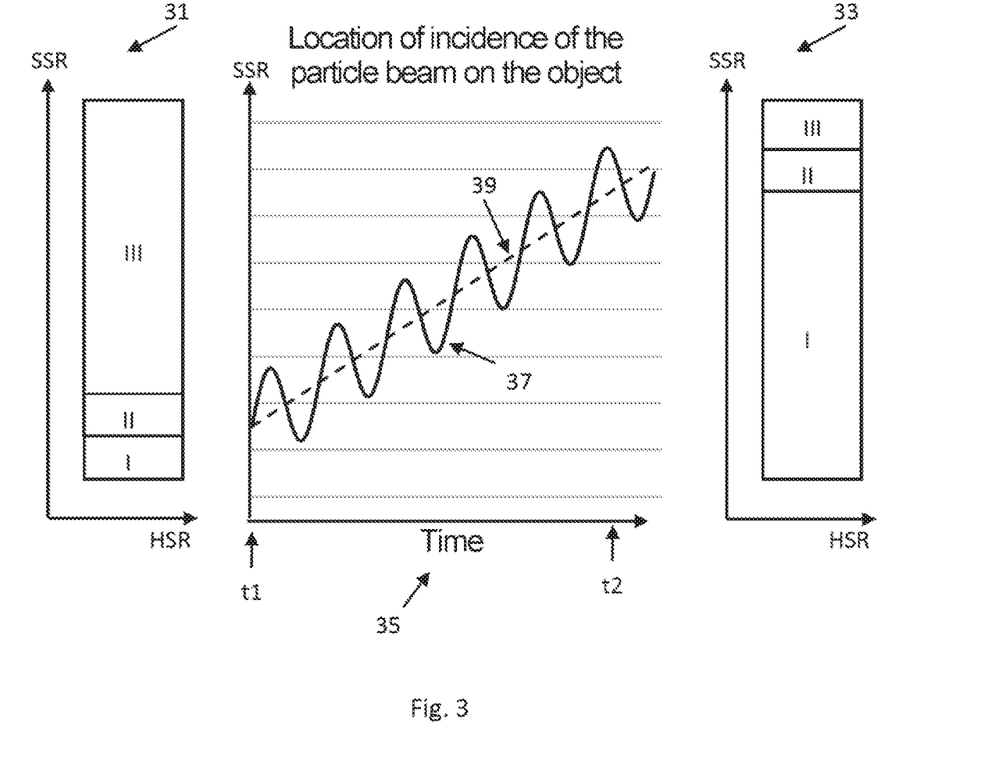
FIG. 3 shows the time profile of the location of incidence of a particle beam on the object along a sub-scanning direction according to a method according to the disclosure.

A corresponding method for processing the object 1 is explained below with reference to FIG. 3. Diagram 31 in FIG. 3 shows regions I, II and III, explained in conjunction with FIG. 1C, at a first time t1 during the method for processing the object. This shows that regions I and II are small in the sub-scanning direction SSR and region III is large in the sub-scanning direction.

Diagram 33 in FIG. 3 shows, in a manner analogous to FIG. 1C, the state of the object processed according to the method at a later time t2. It shows that region I, i.e., the processed region of the object, has increased in the sub-scanning direction in comparison with the state shown in diagram 31, i.e., material was removed from the object. Region II has been displaced in the sub-scanning direction since the cut surface 3 was moved in the direction of the sub-scanning direction by the removal of material from the object 1. Compared to the state shown in diagram 31, region III has been reduced in size in diagram 33 since material was removed from the object 1.

Diagram 35 in FIG. 3 schematically shows the time profile of the location of incidence 23 of the particle beam 5 on the object 1 in the sub-scanning direction, in the form of the graph 37. Accordingly, the location of incidence 23 of the particle beam 5 on the object 1 carries out an SSR overall movement, which is composed of two partial movements. The first partial movement is a periodic back-and-forth movement of the location of incidence 23 with respect to a reference position 39, the time profile of which in respect of the object 1 is illustrated by a dashed line in diagram 35. The second partial movement is the movement of the reference position 39 with respect to the object 1 according to the dashed line illustrated in the diagram 35. Consequently, the overall movement of the location of incidence 23 with respect to the object 1 is in the sub-scanning direction, although it is periodically accelerated and decelerated along the sub-scanning direction in periodic fashion and even moved forwards and backwards in periodic fashion.

As a result of the SSR overall movement of the location of incidence 23 of the particle beam 5 on the object 1, illustrated in the diagram 35, material is removed from the object 1 along the sub-scanning direction. During the removal of material from the object in the sub-scanning direction, the particle beam 5 is also moved along the principal scanning path in order to remove material from the object 1 along the cut surface 3, with the principal scanning path in the present example being restricted, merely for the purposes of the simplified explanation, to a straight movement along the principal scanning direction HSR. In general, the principal scanning path is any desired path.

The overall movement of the location of incidence 23 of the particle beam 5 relative to the object 1 is explained in more detail below on the basis of a plurality of diagrams in FIG. 4. Diagram 41 shows the time profile of the position of the location of incidence 23 with respect to the object 1 in the sub-scanning direction (like graph 37 in diagram 35 of FIG. 3). The SSR overall movement of the location of incidence 23 with respect to the object 1 illustrated in diagram 41 arises by the superposition of the partial movements illustrated in diagrams 43 and 45, which are linked to one another with the aid of the reference position. Diagram 43 shows a first partial movement, specifically the time profile of the location of incidence 23 with respect to the reference position 39 (which is indicated by the dashed line in diagram 35 of FIG. 3) along the sub-scanning direction. Diagram 45 shows the second partial movement, specifically the time profile of the reference position 39 with respect to the object 1 along the sub-scanning direction.

The first partial movement illustrated in diagram 43 corresponds to periodic back-and-forth movement of the location of incidence 23 with respect to the reference position 39 along the sub-scanning direction. Accordingly, the location of incidence 23 is periodically moved back and forth along the sub-scanning direction with respect to the reference position 39.

According to the second partial movement, illustrated in diagram 45, the reference position 39 is continuously moved forwards with respect to the object 1 along the sub-scanning direction.

The superposition of the first partial movement illustrated in the diagram 43 and the second partial movement illustrated in diagram 45 to form the SSR overall movement illustrated in diagram 41 causes the location of incidence 23 of the particle beam 5 with respect to the object 1 to be effectively moved forwards along the sub-scanning direction and, in the process, to be accelerated and decelerated and to even be moved forwards in part and backwards in part.

Figure 4:
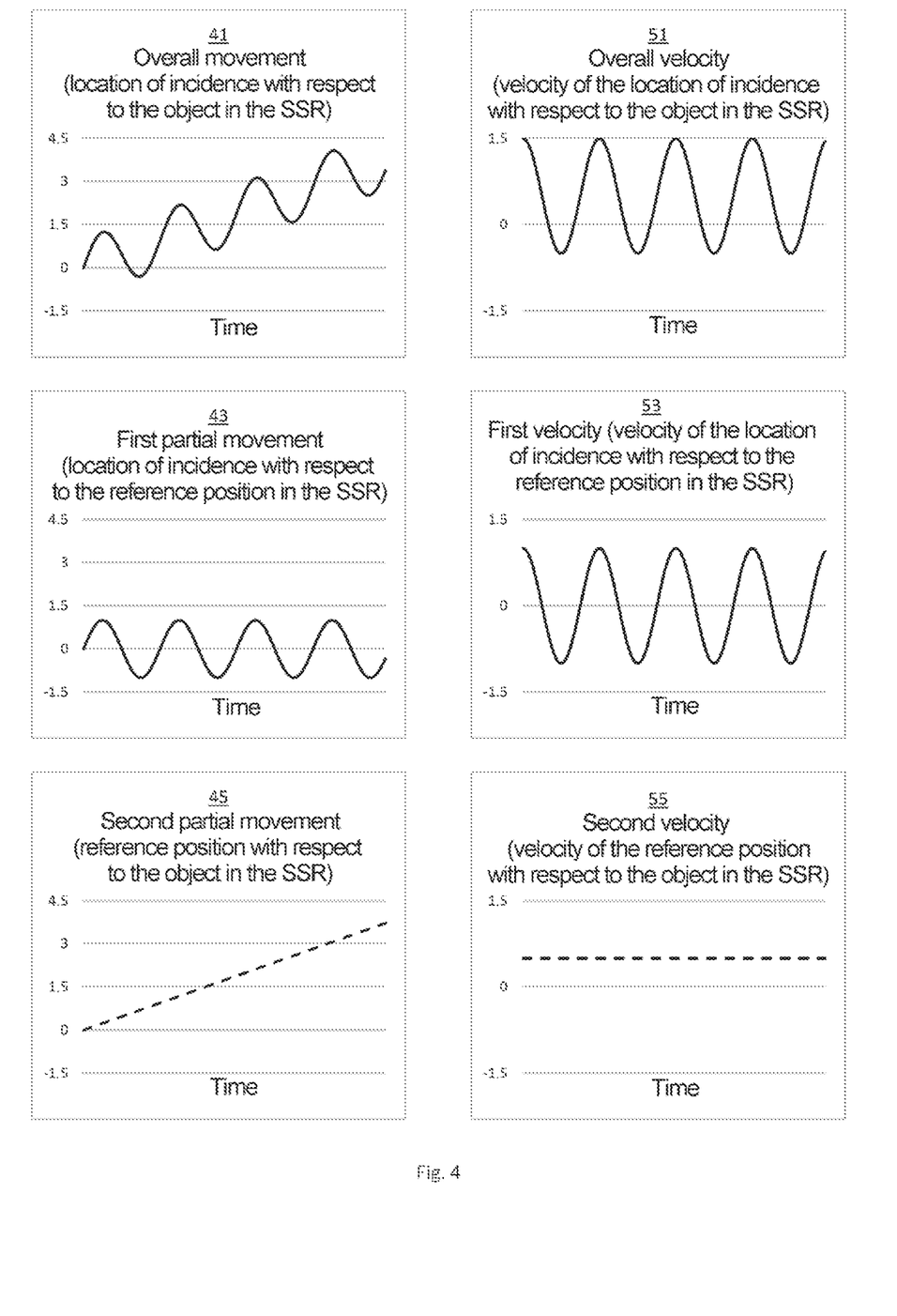
FIG. 4 shows details in respect of the time profile of the SSR overall and partial movements of the location of incidence of the particle beam on the object, and of the time profile of the SSR overall velocity, the first velocity and the second velocity.

Diagram 51 in FIG. 4 shows the time profile of the SSR overall velocity 52 of the location of incidence 23 with respect to the object 1. The overall velocity 52 of the location of incidence 23 with respect to the object 1 in the sub-scanning direction, illustrated in the diagram 51, is composed of a first velocity 54, the time profile of which is illustrated in the diagram 53, and a second velocity 56, the time profile of which is illustrated in diagram 55.

Diagram 53 shows the time profile of the first velocity 54, specifically the velocity of the location of incidence 23 with respect to the reference position 39 in the sub-scanning direction. According to the example illustrated in diagram 53, the first velocity 54 alternately decreases and increases. This means that the location of incidence 23 in the sub-scanning direction is alternately accelerated and decelerated with respect to the reference position 39. Moreover, the first velocity 54 alternately has positive and negative values. This means that the location of incidence 23 in the sub-scanning direction is alternately moved forwards and backwards with respect to the reference position 39.

Diagram 55 shows the time profile of the second velocity 56, specifically the velocity of the reference position 39 with respect to the object 1 in the sub-scanning direction. In the example shown in diagram 55, the second velocity 56 is constant in time for reasons of a simplified illustration. However, according to the method according to the disclosure, the second velocity 56 is continuously set anew (e.g., regulated) on the basis of the reference signal and the detection signal and therefore has changes over time. According to the time profile of the second velocity 56 shown in diagram 55, the reference position 39 is moved forwards with constant speed in the sub-scanning direction with respect to the object 1.

The overall velocity 52 shown in diagram 51 is composed of the first velocity 54 shown in diagram 53 and the second velocity 56 shown in diagram 55. The overall velocity 52 alternately decreases and increases. Therefore, with respect to the object 1, the location of incidence 23 is alternately accelerated and decelerated in the sub-scanning direction. Further, the overall velocity 52 has alternately positive and negative values such that the location of incidence 23 with respect to the object 1 is alternately moved forwards and backwards in the sub-scanning direction.

According to the method according to the disclosure, the first velocity 54 is constantly changed in accordance with the reference signal. By way of example, this means that the time profile of the first velocity 54, illustrated in diagram 53, has a frequency that corresponds to the frequency of the reference signal. Consequently, the first velocity 54 is changed with the frequency of the reference signal.

As may be gathered from diagrams 41 and 51, the contribution of the first partial movement or the first velocity 54 leads to the location of incidence 23 of the particle beam 5 on the object 1 being alternately moved forwards and backwards with respect to the object 1 in the sub-scanning direction. As a result, the particle beam 5 can be continuously moved back and forth at the cut surface 3 such that the particle beam 5 is repeatedly successively directed, in this sequence, on regions I, II and III and, again, on regions III, II, I. While the particle beam 5 is moved at the cut surface 3 in periodic fashion in the sub-scanning direction by the contribution of the first partial movement or the first velocity 54, the contribution of the second partial movement or the second velocity 56 leads to material being removed from the object 1 in such a way that the cut surface 3 is displaced forwards in the direction of the sub-scanning direction, as illustrated by diagrams 31 and 33 in FIG. 3. As a result of the periodic movement of the particle beam 5 at the cut surface 3 along the sub-scanning direction due to the contribution of the first partial movement or the first velocity 54, the contribution to the detection signal, which is caused by the removal of material at the cut surface 3 and which is modulated by the periodic movement with the frequency of the reference signal, can be determined and used to control the second velocity 56 or the second partial movement. In this way, it is possible to capture and control the ablation rate of material in the sub-scanning direction, without having to record images of the object in the meantime.

FIG. 4 only shows movements and velocities in the sub-scanning direction. However, in accordance with the method according to the disclosure, the particle beam 5 is also moved over the object along the principal scanning path. Accordingly, the overall movement of the location of incidence of the particle beam 5 on the object 1 is a superposition of the movement along the principal scanning path and the SSR overall movement. In particular, the movements of the location of incidence of the particle beam along the principal scanning path and in the sub-scanning direction are implemented simultaneously.

Figure 5A:
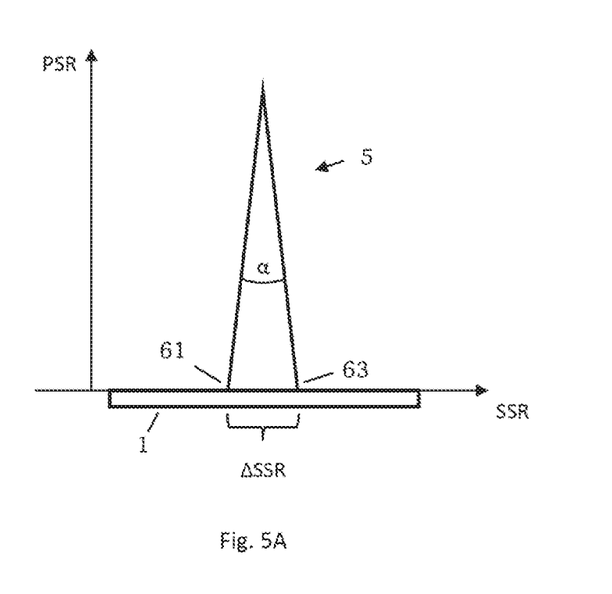
FIGS. 5A and 5B show deflections of a particle beam during the method according to the disclosure.

FIG. 5A shows two time-offset states of the particle beam 5 during the movement of the particle beam 5 over the object 1 in the sub-scanning direction, with only the first velocity component of the overall velocity and only the first partial movement component of the overall movement being illustrated. The first state corresponds to directing the particle beam 5 on a first location 61 of the object 1 at a first time. As a result of the first velocity component of the overall velocity of the particle beam 5 over the object 1 in the sub-scanning direction or as a result of the first partial movement component of the overall movement of the particle beam over the object in the sub-scanning direction, the particle beam 5 is directed on a second location 63 of the object 1 at a second time. The two locations 61 and 63 have a distance $\Delta$SSR from one another in the sub-scanning direction, the distance only being caused by the first velocity component of the overall velocity or by the first partial movement component of the overall movement. This distance is likewise illustrated in diagram 43 of FIG. 4.

The first partial movement or the first velocity component of the overall velocity of the particle beam or the location of incidence thereof in respect of the object can be brought about, for example, by deflecting the particle beam 5 in relation to the particle beam column 13, illustrated in FIG. 2A, via the deflectors 15. In so doing, the particle beam 5 can be deflected to the extent of a sub-scanning deflection angle $\alpha$ in a sub-scanning direction, which is illustrated schematically in FIG. 5A. Therefore, the sub-scanning deflection angle $\alpha$ represents an angle through which the particle beam 5 is deflected by the first velocity component or by the first partial movement component in the sub-scanning direction while the particle beam 5 moves over the object 1 in the sub-scanning direction.

Figure 5B:
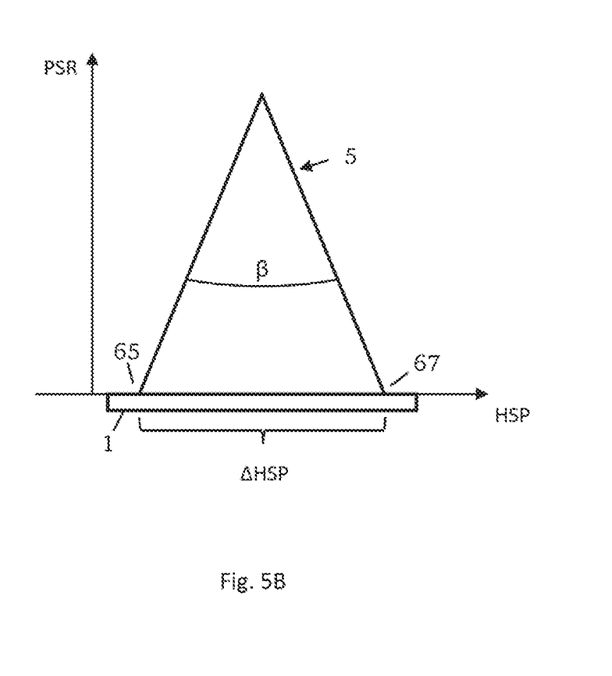

FIG. 5B shows two time-offset states of the particle beam 5 during the movement of the location of incidence of the particle beam 5 on the object 1 along the principal scanning path. The particle beam 5 is directed on a location 65 on the object 1 at a first time, which does not necessarily correspond to the first time in conjunction with FIG. 5A. At a later time during the movement of the location of incidence of the particle beam 5 on the object 1 along the principal scanning path, the particle beam 5 is directed on another location 67 on the object 1 along the principal scanning path. The two locations 65 and 67 have a distance $\Delta$HSP from one another along the principal scanning path.

The maximum distance $\Delta$HSP obtained by the movement of the location of incidence of the particle beam 5 on the object 1 along the principal scanning path and the maximum distance $\Delta$SSR, i.e., the maximum distance between two locations on the object 1 that is achieved by the first velocity component of the overall velocity or by the first partial movement of the overall movement of the particle beam in the sub-scanning direction, are generally not the same. By way of example, the maximum distance $\Delta$HSP can be many times larger than the maximum distance $\Delta$SSR. By way of example, the maximum distance $\Delta$HSP is at least 5 times, at least 10 times or at least 20 times larger than the maximum distance $\Delta$SSR.

During the movement of the location of incidence 23 of the particle beam 5 along the principal scanning path (HSP), the particle beam 5 can be deflected to the extent of a principal scanning deflection angle $\beta$. The principal scanning deflection angle $\beta$ can represent the maximum deflection of the particle beam 5 in relation to the particle beam column 13 which is attained during the movement of the location of incidence 23 of the particle beam 5 along the principal scanning path (HSP). Usually, the principal scanning deflection angle $\beta$ is greater than the sub-scanning deflection angle $\alpha$. In particular, the principal scanning deflection angle $\beta$ is at least 5 times, at least 10 times or at least 20 times greater than the sub-scanning deflection angle $\alpha$.

Figure 6:
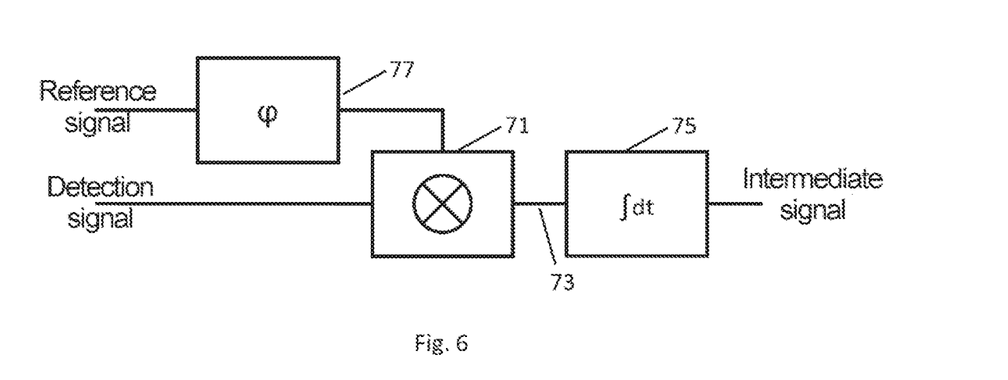
FIG. 6 shows a variant for implementing a homodyne detection.

FIG. 6 shows an example for determining an intermediate signal on the basis of the reference signal and the detection signal, wherein the intermediate signal can be used to control the movement of the location of incidence 23 of the particle beam 5 along the sub-scanning direction, or for setting the second velocity. Consequently, FIG. 6 shows an implementation of the principle of homodyne detection.

FIG. 6 shows an exemplary signal processing chain for producing the intermediate signal on the basis of the reference signal and the detection signal. The signal processing chain includes determining a mixed signal 73 by multiplicative mixing 71 of the reference signal and the detection signal. The mixed signal 73 is produced by multiplicative mixing 71, the mixed signal containing at least a signal component with the difference frequency between the frequencies of the reference signal and of the detection signal.

The phase between the reference signal and the detection signal can be set by a phase shifter 77. For the purposes of implementing the homodyne detection, the assumption is made that the frequency of the reference signal and the frequency of the detection signal are substantially the same or that the detection signal contains contributions with a frequency that is substantially the same as the frequency of the reference signal.

The intermediate signal is produced by a moving window integration of the mixed signal 73 over a plurality of periods of the frequency of the reference signal. The moving window integration is carried out by an integrator 75, which is realized by a low-pass filter, for example. The intermediate signal substantially only contains those contributions to the detection signal whose frequencies substantially equal the frequency of the reference signal. By modulating the intensity of the particle beam 5 supplied to the object 1 or from the component of the first velocity or the first partial movement of the movement of the particle beam with respect to the object in the sub-scanning direction, the detection signal contains contributions in the spectral range about the frequency of the reference signal that are caused by modulating the directing of the particle beam. By way of example, if the particle beam 5 is moved periodically in the sub-scanning direction at the cut surface 3 of the object 1 by the first velocity component of the overall velocity or by the first partial movement at the frequency of the reference signal, the detection signal substantially contains the contributions in the spectral range around the frequency of the reference signal that are dominated by the removal of material at the cut surface 3 of the object 1. Therefore, the intermediate signal is an approximation for the ablation rate of material from the object in the sub-scanning direction. By way of example, the intermediate signal is approximately proportional to the ablation rate of material from the object in the sub-scanning direction. Therefore, the intermediate signal can be used to control the movement of the location of incidence 23 of the particle beam 5 along the sub-scanning direction or for controlling the second velocity.

Figure 7:
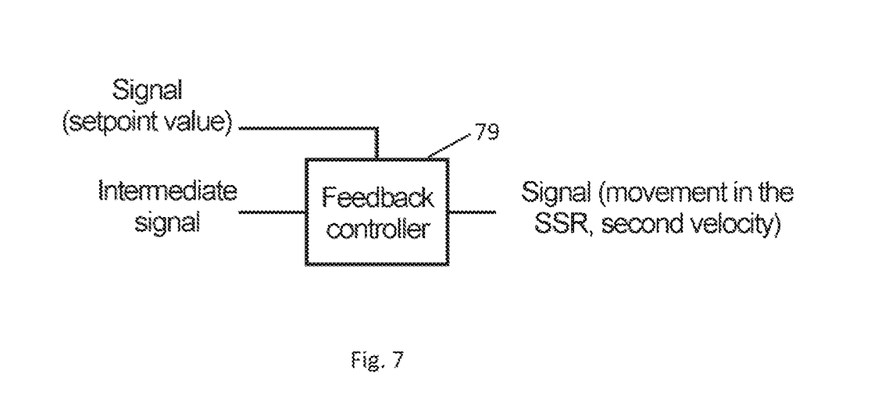
FIG. 7 shows a feedback controller for controlling the movement of the particle beam over the object.

FIG. 7 shows an exemplary feedback controller 79, via which a signal that represents the movement of the location of incidence 23 of the particle beam 5 along the sub-scanning direction or the second velocity is set using a signal representing a setpoint value and using the intermediate signal. Expressed differently, the movement of the location of incidence 23 of the particle beam 5 along the sub-scanning direction or the second velocity is set by the feedback controller 79 that uses the intermediate signal to this end. By way of example, the intermediate signal can be produced via the signal processing chain shown in FIG. 6. The feedback controller 79 can be implemented in various ways and serves to set the movement of the location of incidence 23 of the particle beam 5 along the sub-scanning direction or the second velocity in such a way that the intermediate signal, which represents the ablation rate of material in the sub-scanning direction, adopts a predetermined setpoint value.

What is claimed is:

1. A method for processing an object, comprising:
   directing a particle beam on the object so that a location of incidence of the particle beam on the object carries out a movement along a principal scanning path and a movement along a sub-scanning direction oriented transverse to the principal scanning path, the movement of the location of incidence of the particle beam along the sub-scanning direction being controlled on the basis of a reference signal and a detection signal;
   modulating the directing of the particle beam in accordance with the reference signal; and
   detecting secondary particles and producing the detection signal, which represents an intensity of the detected secondary particles,
   wherein the method removes material from the object.

2. The method of claim 1, wherein modulating the directing of the particle beam comprises modulating the intensity of the particle beam supplied to the object in accordance with the reference signal.

3. The method of claim 2, wherein the intensity of the particle beam supplied to the object is modulated:
   by virtue of the particle beam, in accordance with the reference signal, alternately being directed on the object and not being directed on the object; or
   by virtue of the particle beam, in accordance with the reference signal, alternately being blocked by a stop such that the particle beam is not directed on the object and passing the stop such that the particle beam is directed on the object.

4. The method of claim 1, wherein:
   controlling the movement of the location of incidence of the particle beam along the sub-scanning direction comprises:
      determining a mixed signal by multiplicative mixing of the reference signal and the detection signal; and
      determining an intermediate signal by integrating the mixed signal; and
   the movement of the location of incidence of the particle beam along the sub-scanning direction is based on the intermediate signal.

5. The method of claim 4, wherein the movement of the location of incidence of the particle beam along the sub-scanning direction is set by a feedback controller that uses the intermediate signal.

6. The method of claim 1, wherein:
   the directing of the particle beam is modulated by virtue of the movement of the location of incidence of the particle beam along the sub-scanning direction being implemented at an overall velocity;
   the overall velocity is composed of at least a first velocity and a second velocity;
   the first velocity is continuously changed in accordance with the reference signal; and
   the second velocity is set on the basis of the reference signal and the detection signal.

7. The method of claim 6, wherein the overall velocity alternately decreases and increases.

8. The method of claim 6, wherein the reference signal is a periodic signal, as a result of which the first velocity is changed in so that the first velocity alternately decreases and increases.

9. The method of claim 6, wherein the second velocity always has positive values.

10. The method of claim 6, wherein:
    setting the second velocity comprises:
       determining a mixed signal by multiplicative mixing of the reference signal and the detection signal; and
       determining an intermediate signal by integrating the mixed signal; and
    the second velocity is based on the intermediate signal.

11. The method of claim 10, wherein the second velocity is set by a feedback controller that uses the intermediate signal.

12. The method of claim 6, wherein the movement of the location of incidence of the particle beam along the sub-scanning direction is implemented by deflecting the particle beam relative to a particle beam column, which produces the particle beam, in accordance with the reference signal and by moving the object relative to the particle beam column in the sub-scanning direction according to the second velocity.

13. The method of claim 6, wherein the particle beam is directed on locations on the object by the component of the first velocity of the overall velocity in the sub-scanning direction, the locations having a distance from one another in the sub-scanning direction that is at least 0.1 nm.

14. The method of claim 6, wherein:
the particle beam is deflected to the extent of a sub-scanning deflection angle in the sub-scanning direction by the component of the first velocity of the overall velocity; and
the sub-scanning deflection angle is at least 0.00001 mrad.

15. The method of claim 1, wherein the movement of the location of incidence of the particle beam along the sub-scanning direction is implemented by deflecting the particle beam relative to a particle beam column, which produces the particle beam.

16. The method of claim 1, wherein the movement of the location of incidence of the particle beam along the sub-scanning direction is implemented by moving the object relative to a particle beam column, which produces the particle beam, in the sub-scanning direction.

17. The method of claim 1, wherein:
the particle beam is directed on locations on the object by moving the location of incidence of the particle beam along the principal scanning path; and
the locations having a distance from one another along the principal scanning path that is at least 1 nm.

18. The method of claim 1, wherein at least one of the following holds:
the sub-scanning direction is oriented substantially perpendicular to the particle beam;
the principal scanning path is oriented substantially perpendicular to the particle beam; and
the sub-scanning direction is oriented substantially perpendicular to the principal scanning path.

19. The method of claim 1, wherein at least one of the following holds:
the reference signal has a frequency that differs from zero; and
the reference signal is a sinusoidal signal or a rectangular signal.

20. The method of claim 1, wherein the movement of the location of incidence of the particle beam along the principal scanning path is carried out at a frequency that is at least 10 times that of a frequency of the reference signal.

21. The method of claim 1, wherein:
during the movement of the location of incidence of the particle beam along the principal scanning path, the particle beam is deflected to the extent of a principal scanning deflection angle; and
the principal scanning deflection angle is at least 0.0001 mrad.

22. The method of claim 1, wherein an image of the object is recorded using a scanning electron microscope while material is removed from the object.

23. The method of claim 22, wherein the movement of the location of incidence of the particle beam along the sub-scanning direction is further controlled on the basis of the recorded image of the object.

24. The method of claim 1, further comprising:
exposing a surface of the object by removing material from the object;
recording an image of the object;
repeating the exposing and recording multiple times; and
producing a cross-sectional image on the basis of the recorded images.

25. The method of claim 1, further comprising producing an object suitable for analysis via transmission electron microscopy by removing material from the object.

26. One or more machine-readable hardware storage devices comprising instructions that are executable by one or more processing devices to perform operations comprising the method of claim 1.

27. A system comprising:
one or more processing devices; and
one or more machine-readable hardware storage devices comprising instructions that are executable by the one or more processing devices to perform operations comprising the method of claim 1.

* * * * *